(12) United States Patent
Sharon et al.

(10) Patent No.: US 8,787,079 B2
(45) Date of Patent: Jul. 22, 2014

(54) READING DATA FROM MULTI-LEVEL CELL MEMORY

(75) Inventors: Eran Sharon, Rishon Lezion (IL); Idan Alrod, Herzliya (IL)

(73) Assignee: Sandisk Technologies Inc., Plano, TX (US)

( * ) Notice: Subject to any disclaimer, the term of this patent is extended or adjusted under 35 U.S.C. 154(b) by 103 days.

(21) Appl. No.: 13/465,308

(22) Filed: May 7, 2012

(65) Prior Publication Data

US 2013/0294157 A1 Nov. 7, 2013

(51) Int. Cl.
G11C 16/04 (2006.01)
G11C 16/06 (2006.01)
G06F 13/00 (2006.01)
G11C 29/00 (2006.01)

(52) U.S. Cl.
USPC ............ 365/185.03; 365/185.09; 365/185.21; 711/103; 714/763

(58) Field of Classification Search
USPC .................................................. 365/185.03
See application file for complete search history.

(56) References Cited

U.S. PATENT DOCUMENTS

| | | | |
|---|---|---|---|
| 7,526,715 B2 | 4/2009 | Litsyn et al. | |
| 7,814,401 B2 | 10/2010 | Alrod et al. | |
| 8,099,652 B1 | 1/2012 | Alrod et al. | |
| 8,254,167 B2 * | 8/2012 | Patapoutian et al. | .... 365/185.03 |
| 8,406,051 B2 * | 3/2013 | Patapoutian et al. | .... 365/185.03 |
| 8,498,152 B2 * | 7/2013 | Alrod et al. | ............. 365/185.03 |
| 2010/0110798 A1 * | 5/2010 | Hoei et al. | ............... 365/185.24 |
| 2010/0208519 A1 * | 8/2010 | Shiga et al. | ............. 365/185.03 |
| 2011/0252283 A1 | 10/2011 | Mokhlesi et al. | |
| 2011/0280069 A1 | 11/2011 | Patapoutian et al. | |
| 2013/0024743 A1 * | 1/2013 | Sharon et al. | .................. 714/763 |
| 2013/0151753 A1 * | 6/2013 | Jeon et al. | ..................... 711/103 |

FOREIGN PATENT DOCUMENTS

WO 2008121577 A1 10/2008

OTHER PUBLICATIONS

International Search Report and Written Opinion from the International Searching Authority (EPO) for International Application No. PCT/US2013/038874, mailed Sep. 5, 2013, 10 pages.

* cited by examiner

*Primary Examiner* — Son Mai (74) *Attorney, Agent, or Firm* — Toler Law Group, PC (57) ABSTRACT

A method at a data storage device includes determining a first hard bit of a first logical page, the first hard bit corresponding to a particular cell of the MLC memory. A second hard bit of a second logical page is sensed. The second hard bit corresponds to the particular cell. The first hard bit is used as a soft bit of the second logical page to provide reliability information during a decode operation of the second logical page.

24 Claims, 3 Drawing Sheets

READING DATA FROM MULTI-LEVEL CELL MEMORY

FIELD OF THE DISCLOSURE

The present disclosure is generally related to reading data from a multi-level cell (MLC) memory.

BACKGROUND

Non-volatile memory devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 2 bits per cell, 3 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the flash memory cell may be programmed to a state that corresponds to the sequence of bits.

Once the memory cells in the memory device have been programmed, data may be read from the memory cells by sensing the programming states of the memory cells. However, sensed programming states can sometimes vary from the written programming states due to one or more factors. Error correction decoding can be used to correct data errors resulting from read states that do not match written states. In addition, "soft" bits may be read from the memory cells by performing additional sense operations to provide additional information regarding the state of the cells. Soft bit information may be used to improve an effectiveness of error correction decoding. However, performing the additional sense operations to generate the soft bits introduces additional latency that may degrade a read performance of the memory device.

SUMMARY

Hard bits of a first logical page of a MLC memory are used as soft bits of a second logical page of the MLC memory. Reliability information may be generated based on the soft bits and used during decoding of the second logical page. Decoding of the second logical page may be enhanced by using the reliability information while avoiding a read performance penalty associated with reading conventional soft bits from the MLC memory.

DETAILED DESCRIPTION

Figure 1:
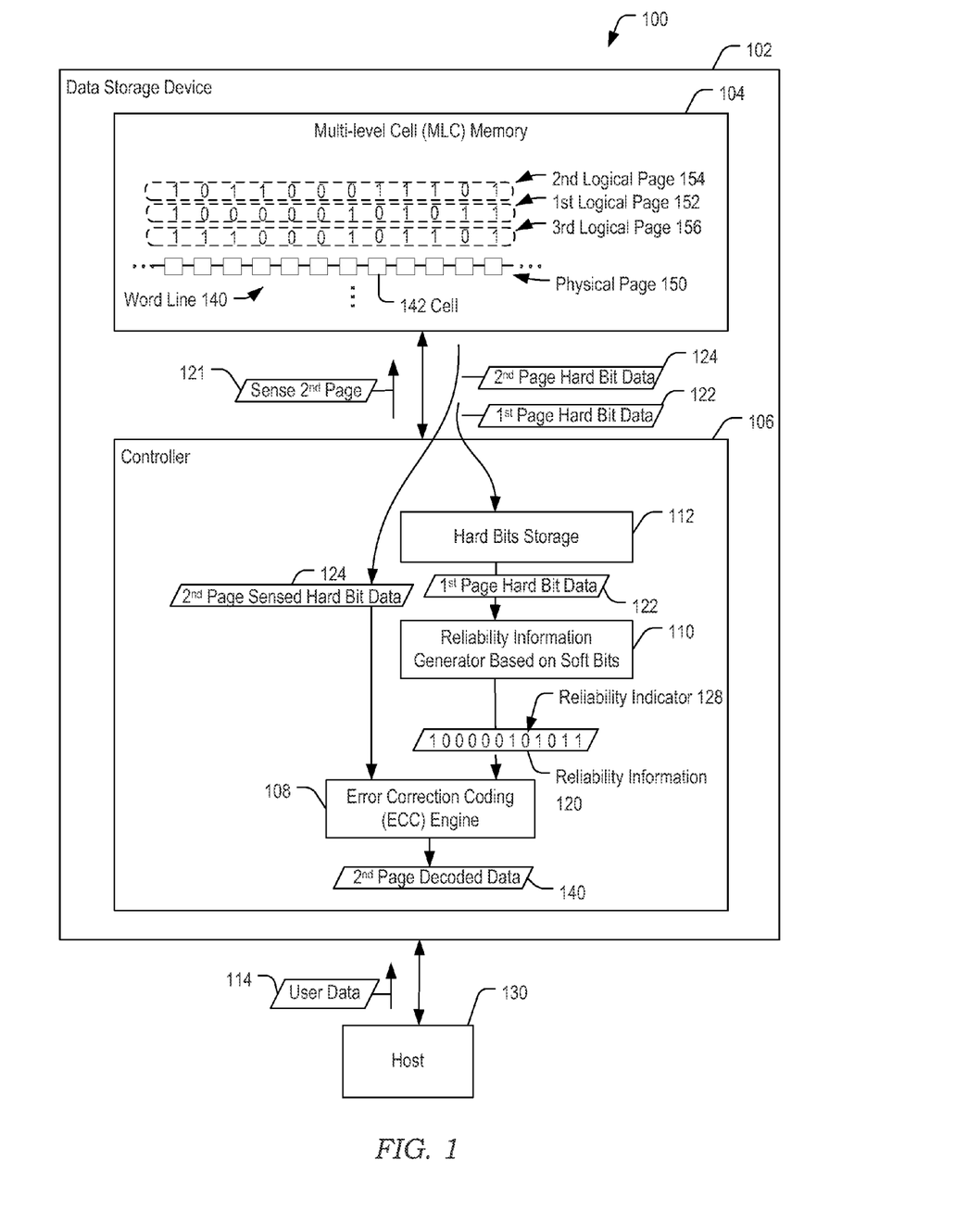
FIG. 1 is a block diagram illustrating a particular embodiment of a system including a data storage device configured to use hard bits from one logical page of a multi-level cell (MLC) memory as soft bits of another logical page of the MLC memory.

Referring to FIG. 1, a particular embodiment of a system 100 includes a data storage device 102 coupled to a host device 130. The data storage device 102 includes a multi-level cell (MLC) memory 104. The data storage device 102 is configured to use hard bits from one logical page of the MLC memory 104 as soft bits of another logical page of the MLC memory 104.

As used herein, a "hard bit" refers to a read value of the stored bit, generated based on sensing at the voltage thresholds that separate the states at which the stored bit changes value. "Soft bits" are bits that provide additional reliability information on the read "hard bit", generated based on a higher resolution reading—i.e. based on sensing at additional voltage thresholds in between the "hard bit" voltage thresholds. The "soft bit" values indicate how close a cell's threshold voltage (Vt) is to the threshold voltage at which the read "hard bit" would change its value.

The host device 130 may be configured to provide data, such as user data 114, to be stored at the MLC memory 104 or to request data to be read from the MLC memory 104. For example, the host device 130 may include a mobile telephone, a music or video player, a gaming console, an electronic book reader, a personal digital assistant (PDA), a computer, such as a laptop computer, a notebook computer, or a tablet, any other electronic device, or any combination thereof.

The data storage device 102 includes the MLC memory 104 coupled to a controller 106. The MLC memory 104 may be a non-volatile memory, such as a NAND flash memory. The MLC memory 104 includes a representative word line 140 of storage elements, such as a word line of a multi-level cell (MLC) flash memory. The word line 140 includes a physical page 150 that includes a representative flash MLC cell 142. The physical page 150 may store a first logical page 152, a second logical page 154, and a third logical page 156. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples.

The controller 106 is configured to receive data and instructions from and to send data to the host device 130 while the data storage device 102 is operatively coupled to the host device 130. The controller 106 is further configured to send data and commands to the MLC memory 104 and to receive data from the MLC memory 104. For example, the controller 106 is configured to send data and a write command to instruct the MLC memory 104 to store data to a specified address. As another example, the controller 106 is configured to send a read command to read data from a specified address of the MLC memory 104.

The controller 106 includes a hard bits storage 112, a reliability information generator 110 based on soft bits, and an error correction coding (ECC) engine 108. The controller 106 is configured to receive sensed information from the MLC memory 104 and to generate reliability information of one logical page by using hard bits read from another logical page. The sensed information received at the controller 106 may include hard bits including a first hard bit of a first logical page of a particular cell of the MLC memory 104. For example, the first hard bit of the first logical page may be a hard bit corresponding to the first logical page 152 read from the cell 142, indicating a "0" bit value. In addition, the controller 106 is configured to receive sensed information including second page hard bit data 124 which may include a second hard bit of a second logical page of the particular cell, such as a bit value "1" of the second logical page 154 from the cell 142. The controller 106 is configured to generate reliability information 120 by using the first hard bit of the first logical page 152 as a soft bit of the second logical page 154. The controller 106 is further configured to initiate a decode operation at the ECC engine 108 of the second logical page 154 using the reliability information 120.

The hard bits storage 112 is configured to store one or more pages of hard bit data. For example, the controller 106 may be configured to store the first page hard bit data 122 in the hard bits storage 112. The first page hard bit data 122 may be used as soft bits that correspond to hard bit data of the second logical page 154 and/or of the third logical page 156. For example, in response to the controller 106 initiating a sense instruction 121 to sense hard bits of the second logical page 154, the controller 106 may receive the second page hard bit data 124 and may provide the sensed second page hard bit data 124 to the ECC engine 108. The controller 106 may be further configured to retrieve the first page hard bit data 122 from the hard bits storage 112 to be provided to the reliability information generator 110 as soft bits corresponding to the second page hard bit data 124.

The reliability information generator 110 may be configured to generate reliability information in response to receiving a soft bit input. For example, the reliability information generator 110 may be configured to generate, for each soft bit received at an input of the reliability information generator 110, a corresponding reliability indicator, such as a representative reliability indicator 128 corresponding to the hard bit of the second logical page 154 from the cell 142. The reliability information generator 110 may perform one or more logical operations, computations, or table look-up operations to generate the reliability information 120 based on the soft bit input, such as described in further detail with respect to FIGS. 2-3.

The ECC engine 108 may be configured to receive data to be stored to the MLC memory 104 and to generate a codeword. For example, the ECC engine 108 may include an encoder configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 108 includes a decoder configured to decode data read from the MLC memory 104 to detect and correct, up to an error correction capability of the ECC scheme, bit errors that may be present in the data.

The ECC engine 108 is configured to perform an ECC decoding operation based on the received hard bit data and further based on received reliability information. For example, the controller 106 may be configured to provide the second page hard bit data 124 at a hard bit input of the ECC engine 108 and to provide the reliability information 120 corresponding to hard bits of the first logical page 152 at a soft bit input of the ECC engine 108. The ECC engine 108 may be configured to generate decoded data, such as second page decoded data 140, based on the received hard bit information (e.g. the second page hard bit data 124) and the received reliability information (e.g. the reliability information 120).

During operation, the controller 106 may receive a request to read data from the MLC memory 104, such as a request to read data corresponding to the second logical page 154. The controller 106 may be configured to perform a read operation to retrieve the hard bit data of the second logical page 154 as sensed second page hard bit data 124 to be provided to the ECC engine 108. In addition, the controller 106 may be configured to provide the first page hard bit data 122 as soft bit data to generate the reliability information 120 to be used during decoding of the second page hard bit data 124. For example, when the first page hard bit data 122 is stored in the hard bits storage 112, such as from a prior read of the first logical page 152, the first page hard bit data 122 may be retrieved from the hard bits storage 112 and provided as a soft bit input to the reliability information generator 110. The reliability information generator 110 may generate the reliability information 120 that is provided to the ECC engine 108 to assist with decoding the second page hard bit data 124.

If the first page hard bit data 122 is not stored in the hard bit storage 112 when a request to read data from the second logical page 154 is received, the controller 106 may be configured to respond to the request to read data from the second logical page 154 by first sensing the hard bit data of the first logical page 152 and storing the received first page hard bit data 122 to the hard bits storage 112. The controller 106 may be configured to next retrieve the hard bit data from the second logical page 154 to be decoded in conjunction with the reliability information 120 based on using the first page hard bit data 122 as soft bits. Alternatively, decoding of the second logical page may be performed based solely on the hard bits of the second logical page, without additional reliability information based on soft bits. In this case, the decoding operation of the second logical page is expected to be longer and its failure probability is expected to be higher. However, extra reading time due to sensing and transfer of the soft bits is avoided. A third option is to read optimized or near-optimized ("conventional") soft bits for the second logical page, which are not based on the hard bits of the first logical page. In this case, the sensing operations for the soft bits are done at read thresholds that may be located at +/−Δ from the hard bit read threshold, and where the Δ value is selected to enhance the soft bit information and is smaller than the Δ value shown in FIG. 2, which is based on the hard bits of the first logical page. Using conventional soft bits, decoding time and the decoding failure probability are reduced as the reliability information is more accurate. However, generation of conventional soft bits requires a designated reading operation that takes additional time. In some implementations, it may be beneficial to use the first logical page hard bit data as the second logical soft bit data only when the first logical page hard bit data is already available from a previous read operation of the first logical page and does not require additional reading operation from memory. The first logical page hard bit data is expected to be available during decode of the second logical page during a sequential reading operation.

By using hard bit data of one logical page (e.g. the first logical page 152) as soft bit data of a second logical page (e.g. the second logical page 154), reliability information may be generated for ECC decoding while avoiding additional read latency associated with reading soft bits in conventional devices. For example, in conventional devices, multiple additional reads of the cells of the physical page 150 may be performed at intermediate voltage values to determine additional sensed information corresponding to the second logical page 154, which may increase a read latency. However, in the data storage device 102, the reliability information 120 that is generated in conjunction with reading the second logical page 154 may be determined by reading the hard bits of one of the other logical pages, such as the first logical page 152. As a result, in a sequential read operation where all logical pages of the physical page 150 are read, soft bit information may be provided without increasing read latency.

A method of providing reliability estimates (e.g. soft bits), in a flash memory system using page-by-page (PbP) reading may therefore be implemented by using hard bits of one or more previously read pages as soft bits for the current page being read. The soft bits generated by using previously read hard bits are referred to as virtual soft bits.

Figure 2:
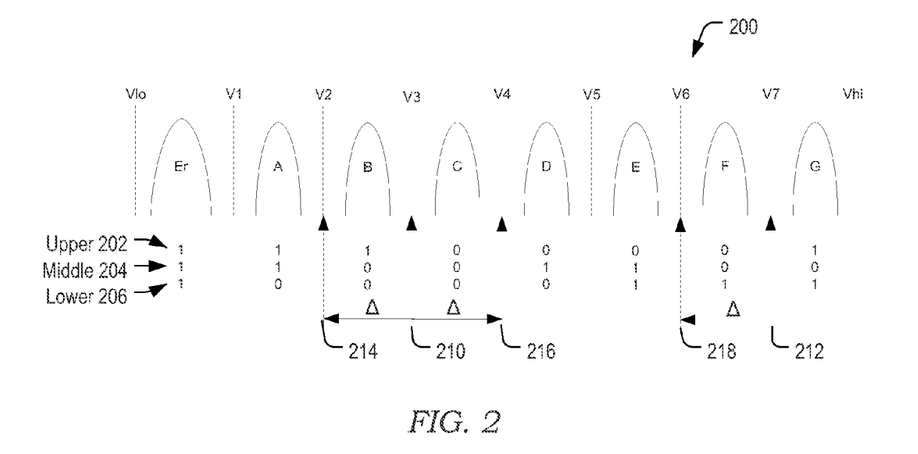
FIG. 2 is a general diagram of a particular embodiment of a mapping of bits to states of a MLC memory that may be used in the MLC memory of FIG. 1 and that illustrates use of hard bits from one logical page of the MLC memory as soft bits of another logical page of the MLC memory.

FIG. 2 is an illustration of a mapping 200 of bits into states in a 3-bit-per-cell flash memory system. For example, the mapping 200 may be used in the data storage device 102 of FIG. 1. Writing data to a flash cell (also referred to as "programming" the flash cell) may include applying voltage pulses to the cell to inject electrons into the cell's floating gate (e.g. from a silicon substrate of the cell through an oxide layer), until the threshold voltage of the cell is high enough within a voltage window of the cell to represent a bit pattern to be programmed to the cell. A threshold voltage of a flash cell is in a voltage range, called a "voltage window," from a low value Vlo to a high value Vhi. In a three-bit-per-cell memory, the voltage window may be divided into eight voltage bands: from Vlo to $V_1$, from $V_1$ to $V_2$, from $V_2$ to $V_3$, from $V_3$ to $V_4$, from $V_4$ to $V_5$, from $V_5$ to $V_6$, from $V_6$ to $V_7$ and from $V_7$ to Vhi. A threshold voltage within one of the voltage bands represents a bit pattern as shown in FIG. 2: a threshold voltage between Vlo and $V_1$ represents the bit pattern "111", a threshold voltage between $V_1$ and $V_2$ represents the bit pattern "110", etc. Although FIG. 2 illustrates 3 bits per cell and a voltage window divided into eight bands, in other implementations the voltage window of an m-bit-per-cell memory may be divided into $2^m$ voltage bands.

An upper page 202 may be read by applying one reference voltage 210 between states B and C, and a second reference voltage 212 between states F and G. A middle page 204 may be read by applying a reference voltage between states A and B, between states C and D, and between states E and F. A lower page 206 may be read by applying a reference voltage between states Er and A and between states D and E. Conventionally, reading a soft bit for the upper page 202 may be implemented by adding four more reference voltages adjacent to the two reference voltages required for reading the upper page 202, such as between $V_2$ and $V_3$, between $V_3$ and $V_4$, between $V_6$ and $V_7$, and between $V_7$ and Vhi.

Conventional systems may attempt to use a desired value for the additional reference voltages according to noise conditions. In contrast to conventional systems, according to the present disclosure the reference voltages for reading the soft bit for the upper page 202 may be the same reference voltages 214, 216, and 218 for reading the middle page 204; thus, the soft bit for the upper page 202 is computed by reading the middle page.

Upon careful inspection of all the states and all the associated bit values of the bits-to-states cell mapping of FIG. 2, it becomes evident that the reliability of a bit can be expressed as a function of the other bits in the cell.

If "0" is used to denote "lower reliability" and "1" is used to denote "higher reliability", then the reliabilities of the bits of FIG. 2 may be given by Table 1.

TABLE 1

| Page | Reliability |
| --- | --- |
| Lower (L) | NOT M |
| Middle (M) | L AND U |
| Upper (U) | M |

According to Table 1, a bit of the lower page L, has a "0" reliability indicator (i.e. "lower reliability") when the corresponding bit of the middle page M has a "1" value and has a "1" reliability indicator (i.e. "higher reliability") when the corresponding bit of the middle page M has a "0" value. A bit of the upper page U has a "0" reliability indicator (i.e. "lower reliability") when the corresponding bit of the middle page M has a "0" value and has a "1" reliability indicator (i.e. "higher reliability") when the corresponding bit of the middle page M has a "1" value. A bit of the middle page M has a "0" reliability indicator (i.e. "lower reliability") when the corresponding bit of the upper page U or of the lower page L (or both) has a "0" value and has a "1" reliability indicator (i.e. "higher reliability") when the corresponding bits of the upper page U and the lower page L have a "1" value.

The present disclosure teaches methods and systems for associating reliabilities to bits read from a page of a flash memory cell, as a function of the readings of at least one other page of the memory.

According to one embodiment of the present disclosure, in a flash memory system, a page of memory is read and transferred to the controller for decoding. The decoder checks whether information from other pages, which can serve as soft bits for the current page, is present in the controller's memory. If the answer is positive, then soft bits for the current page is computed, and the decoding proceeds with the hard bits of the current page and the soft bits are computed (e.g. according to Table 1) from the pages stored in the controller's memory.

If there is no information from other pages, then the decoding may proceed based on the hard bit information from the current page alone. Alternatively, the controller may check whether other pages, which can serve as soft bits for the current page, are scheduled for reading. If the answer is positive, the controller may postpone the decoding of the current page until the other relevant pages are read from the memory.

In conventional flash memory, reading with a higher resolution to obtain conventional soft bits involves adding reading voltages between the predefined reading voltages of the system. Each additional reading voltage requires an additional sensing operation which consumes additional power, and in some cases may add time to the decoding process, thus degrading the read performance.

The present disclosure enables generation of virtual soft bits without having to perform extra sense operations whenever several pages of a word line (WL) are read. The virtual soft bits of the present disclosure may not be as strong as conventional soft bits, but the virtual soft bits are generated with almost no performance penalty.

A fresh flash memory device with minimal wear may be able to decode its contents correctly with the additional help of the reliability bits of the present disclosure. Decoding using the reliability bits of the present disclosure may enable faster convergence to a decoding result and therefore may be faster than decoding with hard bits alone and may save significant power relative to decoding based on conventional soft bits.

As indicated in Table 1, there is an option of creating a reliability estimate for one bit as a logical function of the other bits of the cell. For example the reliability for the lower bit is NOT M, where M is the middle bit, and the reliability for the middle bit M is L AND U, where L stands for lower bit and U is the upper bit.

An alternative implementation for computing the reliability for the lower bit is to use the Middle page as a pointer to a corresponding lookup table. Similarly, in order to generate the reliability for the middle page performing the logical operation "L AND U" may be avoided by using the Lower and Upper pages respectively as pointers to a corresponding lookup table with two inputs.

Figure 3:
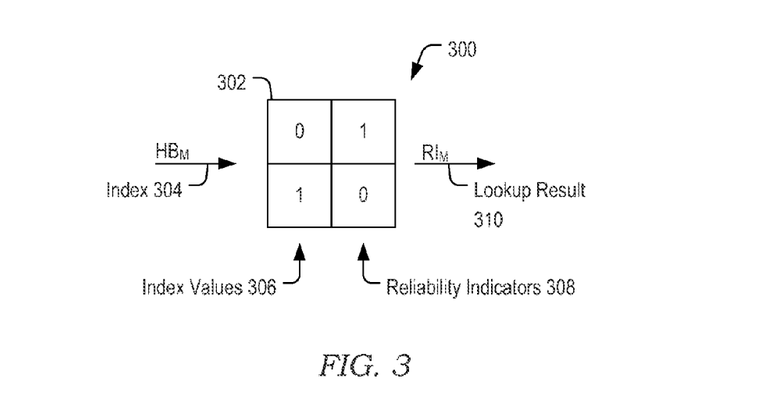
FIG. 3 is a general diagram that illustrates determining reliability information for one logical page of a MLC memory based on a table lookup using hard bits of another page of the MLC memory that may be used in the data storage device of FIG. 1.

FIG. 3 illustrates a particular embodiment 300 of a table lookup using hard bits of one page of the MLC memory to determine reliability information for another logical page of a MLC memory. A table 302 includes a column of index values 306 and corresponding reliability indicators 308. For example, an index of "0" may represent a hard bit of the middle page 204 of FIG. 2 having a "0" value and may correspond to a reliability value of "1" that indicates a bit of the upper page 202 of FIG. 2 is less reliable as compared to the hard bit of the middle page 204 having a "1" value (corresponding to a reliability value of "1" of the bit of the upper page 202).

A table lookup operation at the table 302 may include providing an index 304 having a value of the m-th hard bit ($HB_M$) of one logical page and receiving a lookup result 310 having a value of a reliability indicator of the m-th bit of another logical page ($RI_M$). Although the table 302 is illustrated as including a single bit index (i.e. a 1 bit look up table), in other embodiments multi-bit indices may be used. For example, a lookup table may provide reliability indicators for bits of the middle page of Table 1 according to values of corresponding bits of the upper page and the lower page (e.g. a 2 bit look up table to duplicate a logical AND operation). Although the table 302 illustrates the reliability indicators 308 as having a "0" value or a "1" value, in other embodiments the reliability indicators may include integer or non-integer values and may include positive and/or negative values.

Although FIG. 3 illustrates a single table 302, multiple tables may be used to generate reliability information. For example, the reliability indicators of Table 1 may be implemented using a first table for the lower page, a second table for the middle page, and a third table for the upper page.

The use of look up tables (with one or two entries) is common in ordinary soft bit computations, so the alternative of using the other bits of the cells as indices into a look up table may be compatible with conventional techniques. For example, some implementations may include a number of 1-bit lookup tables and a number of 2-bit look up tables, with some of the tables reserved for future use. The present disclosure may use such reserved tables for computation of the reliability bits.

The present disclosure may be generalized for other mappings as well as for cells storing 4 bits or more according to the specific mappings of bits-to-states that may be applied in the MLC memory.

Another example of an embodiment of the present disclosure may use only the middle page as a reliability measure for the upper page and the lower page, but does not use the lower and upper pages to compute a reliability measure for the middle page. For example, simulated results may indicate that the middle page may not benefit as significantly from the reliability computation based on the upper and lower pages as the upper and lower pages benefit from reliability based on the middle page.

Figure 4:
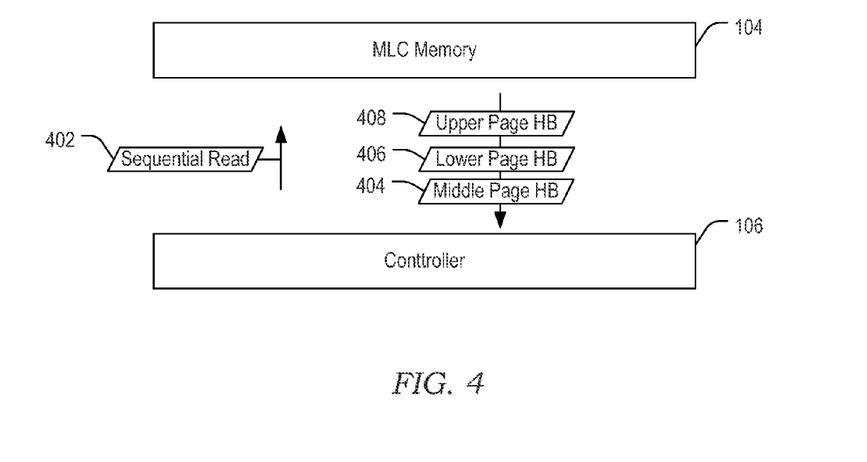
FIG. 4 is a block diagram showing a particular embodiment of a sequence of logical page sense operations performed in response to a sequential read operation at the MLC memory of FIG. 1.

FIG. 4 illustrates a particular embodiment of a sequence of logical page sense operations in response to a sequential read operation at the MLC memory 104 of FIG. 1. The controller 106 sends a sequential read instruction 402 to the MLC memory 104. In response to the sequential read instruction 402, the MLC memory 104 provides data read from the requested physical page as middle page hard bits 404, followed by lower page hard bits 406, followed by upper page hard bits 408. The data pages received from a host to be stored to the MLC memory 104 may therefore be mapped into the middle, lower, and upper pages, in that order.

During a read from the MLC memory, if a sequential read is performed, the first page to be read may be the middle page, and the middle page is read without using any virtual soft bits. For example, data may be programmed to the multiple logical pages according to a sequential read order of the data such that during a sequential read operation the hard bits of the middle logical page are sensed prior to sensing any other logical page of the group of cells (e.g. the lower page and the upper page). During programming of data to the group of cells, a mapping between logical pages and physical pages of a word line may be set according to which a hard bits page of multiple hard bits pages of the group of cells that provides a highest correction capability as a virtual soft bit page is mapped to a first sequential logical page of the word line. As a result of setting the mapping, during a sequential read operation of the data from the group of cells, the hard bits page providing the highest correction capability as a virtual soft bit page is sensed prior to sensing any of the other hard bits pages of the group of cells. When the lower and upper pages are read, the lower and upper pages may use the middle page as a virtual soft bit for generating a refined reliability measure for each, and hence the upper and lower pages may benefit from lower decoding latency. In order for the middle page to be used as a virtual soft bit for the other pages, the middle page may be kept in random access memory (RAM) (e.g. in the hard bits storage 112 of FIG. 1) until completion of reading of the other pages. After completion of reading the upper and lower pages, the middle page may be discarded from the RAM.

If there is an indication that decoding should be performed using hard bits alone, the middle page may be discarded immediately after being decoded. Alternatively, if a page that is read following the reading of the middle page is not from the same word line as the middle page, the middle page may be immediately discarded.

Another embodiment of the present disclosure includes reading hard bits of one page in place of reading soft bits of another page. For example, conventional flash decoders have the capability to read (for every page) one page of hard bit information and another page of "soft" bit information. According to the present disclosure, the page used for "soft" bit information may be configured to read the hard bit information (or a function of the hard bit information) of a different page, which serves as virtual "soft" bit information for the page of hard bit information.

Another embodiment of the present disclosure may use the information from bits that flipped signs during decoding of one page as "soft" bit information for decoding a different page. For example, a flash memory may store three bits in each cell according to the mapping 200 of FIG. 2.

In this case, the upper page 202 has a transition between states B and C and another transition between states F and G, while the middle page 204 has transitions between A and B, between C and D, and between E and F. The middle page 204 can serve as a soft bit for the upper page 202, where if the middle page 204 is '1' the result of the upper page 202 may be considered more reliable than if the middle page is '0'. However, if the input to the middle page decoder was a '0', but the value changed during decoding to '1', then the analog voltage of the middle page 204 may be likely to be closer to the transition point (e.g. close to $V_2$ or $V_4$) and therefore the reading of the upper page 202 should be considered more reliable than in the case where the middle page 204 is read as '0' and also decoded as '0', (and possibly less reliable than in the case where the middle page 204 was read as '1' and also decoded as '1'). Similarly, when the middle page 204 is read as '1' but decoded to '0', reliability of the corresponding upper page 202 may decrease as compared to the case where the middle page 204 is read as '1' and also decoded as '1'.

Figure 5:
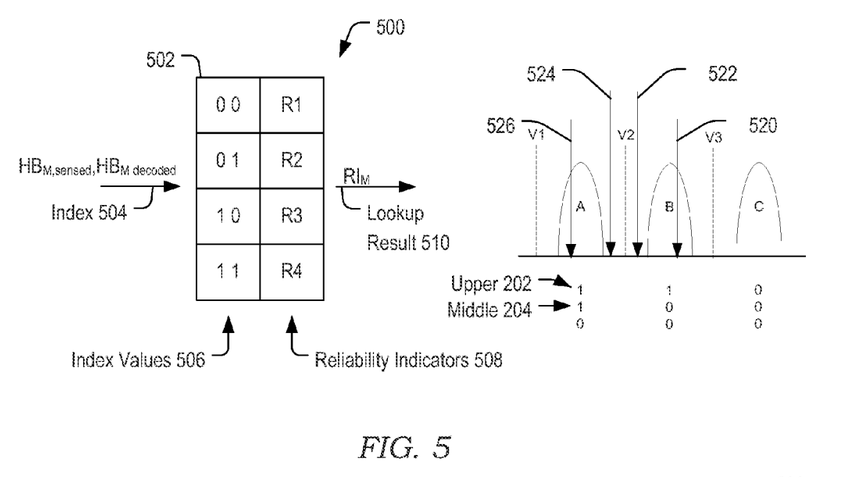
FIG. 5 is a general diagram that illustrates determining reliability information for one logical page of a MLC memory based on a table lookup using sensed values and decoded values of hard bits of another page of the MLC memory that may be used in the data storage device of FIG. 1.

FIG. 5 illustrates a particular embodiment 500 of a table lookup using sensed values and decoded values of hard bits of one page of the MLC memory to determine reliability information for another logical page of a MLC memory. A table 502 includes a column of two-bit index values 506 and corresponding reliability indicators 508. A first bit of the index values 506 corresponds to a sensed hard bit value and a second bit of the index values 506 corresponds to a decoded hard bit value (e.g. after ECC correction). For example, an index of "0 0" may represent a hard bit of the middle page 204 of FIG. 2 being sensed as having a "0" value and decoded as having a "0" value, such as corresponding to a cell having a first threshold voltage 520. An index of "0 1 may represent a hard bit of the middle page 204 of FIG. 2 being sensed as having a "0" value but decoded as having a "1" value. For example, a cell may have been programmed to state A and may have been disturbed to be sensed in state B, such as a cell corresponding to a second threshold voltage 522. An index of "1 0 may represent a hard bit of the middle page 204 of FIG. 2 being sensed as having a "1" value but decoded as having a "0" value. For example, a cell may have been programmed to state B and may have been disturbed to be sensed in state A, such as a cell corresponding to a third threshold voltage 524. An index of "1 1" may represent a hard bit of the middle page 204 of FIG. 2 being sensed as having a "1" value and decoded as having a "1" value, such as corresponding to a cell having a fourth threshold voltage 526.

A table lookup operation at the table 502 may include providing an index 504 having a sensed value and a decoded value of the m-th hard bit ($HB_{M, sensed}$, $HB_{M, decoded}$) of one logical page and receiving a lookup result 510 having a value of a reliability indicator of the m-th bit of another logical page ($RI_M$). A value of the reliability indicator may correspond to a distance from the transition voltage (e.g. a distance from the voltage V3 that indicates a transition of the upper page 202) such that cells having a threshold closer to the transition voltage may be considered less reliable than cells farther from the transition voltage. An index of "0 0" may correspond to a first reliability value R1, an index of "0 1" may correspond to a second reliability value R2, an index of "1 0" may correspond to a third reliability value R3, and an index of "1 1" may correspond to a fourth reliability value R4. R1 may indicate a lower reliability than R2, R2 may indicate a lower reliability than R3, and R3 may indicate a lower reliability than R4. However, in other implementations, different reliability values may be assigned. For example, in some implementations, R2 may equal R3, R2 may equal R1, or R3 may equal R4, as illustrative examples.

Although FIG. 5 illustrates determination of reliability based on sensed values and decoded values using a table lookup, in other implementations a determination of reliability based on sensed values and decoded values may be performed via one or more logical operations or computations. For example, logical operations may include NOT ($HB_{M, sensed}$) AND NOT ($HB_{M, decoded}$) corresponds to R1, NOT ($HB_{M, sensed}$) AND ($HB_{M, decoded}$) corresponds to R2, ($HB_{M, sensed}$) AND NOT ($HB_{M, decoded}$) corresponds to R3, and ($HB_{M, sensed}$) AND ($HB_{M, decoded}$) corresponds to R4.

By providing virtual soft bits for use with decoding, a decoding duration may be reduced as compared to decoding using hard bits only. In addition, because the virtual soft bits correspond to hard bits of other pages, the virtual soft bits may be provided with reduced latency as compared to conventional soft bits. As a result, a read throughput or read performance of a system such as depicted in FIG. 1 may exceed a throughput of a conventional system that uses hard bits only or that uses soft bits under a variety of conditions.

Figure 6:
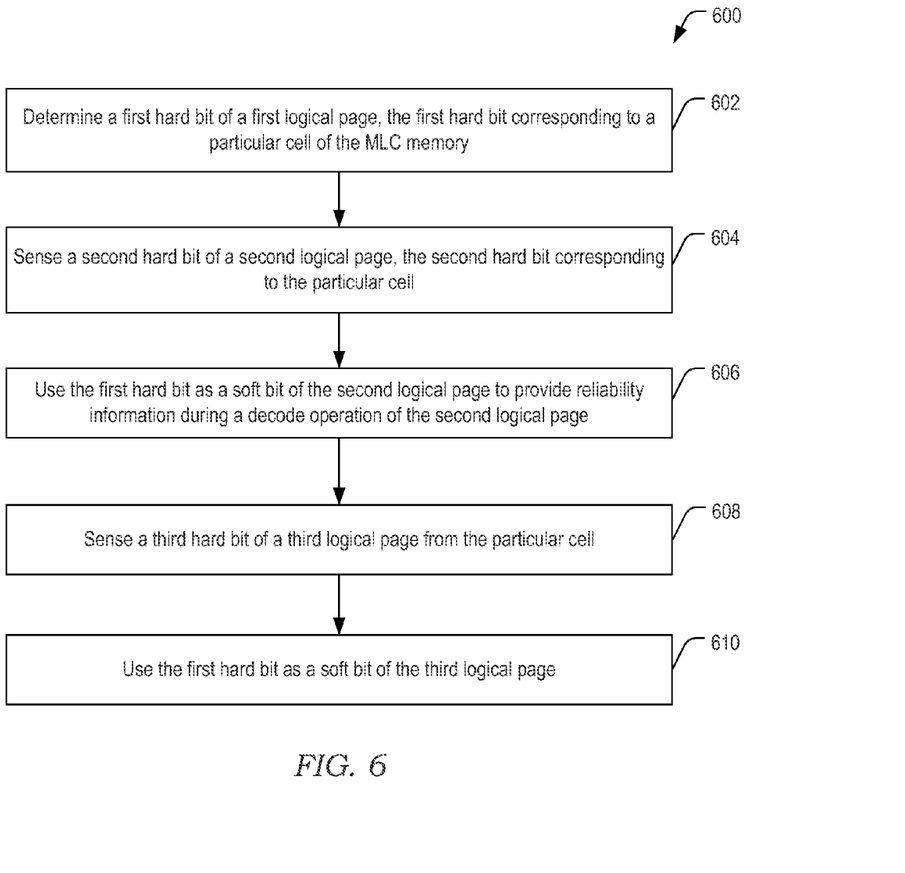
FIG. 6 is a flow chart of a particular illustrative embodiment of a method of reading data from a MLC memory.

FIG. 6 illustrates a particular embodiment of a method 600 of reading data of a MLC memory. The method 600 may be performed in a data storage device having a multi-level cell (MLC) memory, such as the data storage device 102 of FIG. 1. A first hard bit of a first logical page is determined, at 602. The first hard bit corresponds to a particular cell of the MLC memory. For example, the first hard bit may be the bit "0" of the first logical page 152 read from the cell 142 of FIG. 1.

A second hard bit of a second logical page is sensed, at 604. The second hard bit corresponds to the particular cell. For example, the second hard bit may be the bit "1" of the second logical page 154 sensed from the cell 142 of FIG. 1.

The first hard bit is used as a soft bit of the second logical page to provide reliability information during a decode operation of the second logical page, at 606. For example, the first hard bit of the first logical page 152 from the cell 142 of FIG. 1 may be used as a soft bit of the second hard bit of the second logical page 154 from the cell 142. To illustrate, the first hard bit may be provided as part of the first page hard bit data 122 to the reliability information generator 110 as soft bit information for the second logical page 154 in order to generate the reliability information 120 for the second logical page 154.

Using the first hard bit as the soft bit of the second logical page may include determining a reliability indicator for the second hard bit as a function of a value of the first hard bit. For example, the reliability indicator may be determined by using the value of the first hard bit as an index to a table lookup operation, such as described with respect to FIG. 3. As another example, the reliability indicator may be determined according to a logical function of one or more hard bit values of the particular cell, such as described with respect to Table 1. Alternatively, or in addition, the reliability indicator may be determined at least partially based on a difference between a sensed value of the first hard bit and a decoded value of the first hard bit. For example, as described previously, if a bit of the middle page 204 is sensed as a "1" value (e.g. sensed in state D) but is decoded to be a "0" value (e.g. originally programmed to state C), the corresponding bit of the upper page 202 may be considered less reliable than if the middle page 204 is both sensed and decoded as a "1" value (e.g. in state D).

A third hard bit of a third logical page may be sensed from the particular cell, at 608, and the first hard bit may be used as a soft bit of the third logical page, at 610. For example, the hard bit of the cell 142 of FIG. 1 may be used as a soft bit for the second logical page 154 and also as a soft bit for the third logical page 156.

In some implementations, the first hard bit may be determined prior to initiating the decoding operation of the second hard bit in response to receiving an instruction to read the second logical page. For example, when an instruction to read the second logical page 154 of FIG. 1 is received prior to the first hard bit being determined (e.g. prior to the first page hard bit data 122 being sensed and/or prior to the first page hard bit data 122 being decoded), the controller 106 may first instruct the MLC memory 104 to sense the first page hard bit data 122 prior to sensing the second page hard bit data 124.

In some implementations, the first hard bit and the second hard bit may be sensed in response to receiving an instruction to perform a soft read that includes sensing hard bits and soft bits of the second logical page. To illustrate, the controller 106 may instruct the MLC memory 104 to read the second logical page 154 using soft bits (e.g. to provide higher resolution data indicating a threshold voltage of each of the MLC cells of the physical page 150). Rather than performing additional sensing operations for the second logical page 154 (e.g. by sensing at intermediate voltages between $V_2$, $V_3$, and $V_4$ of FIG. 2), the MLC memory 106 may sense hard bits of the second logical page 154 (e.g. by sensing at voltages $V_2$, $V_4$, and $V_6$ of FIG. 2)

In some implementations, in response to receiving an instruction to perform a sequential read of multiple logical pages of a group of cells including the particular cell, hard bits of the first logical page of the group of cells may be sensed prior to sensing any other logical page of the group of cells, such as described with respect to FIG. 4. To illustrate, when a sequential read is to be performed from the physical page 150 of FIG. 1, an order of reading the logical pages may be modified from a requested order so that the first logical page 152 is read prior to reading the other logical pages 154, 156 to be available as soft bits for generating the reliability information 120 for the other logical pages 154, 156. The first logical page may be selected based on a number of transitions of the first logical page in a mapping of bits to states of the group of cells (e.g. the middle page 204 of FIG. 2 having the most transitions in the mapping 200 may be selected to be used as soft bits for the upper page 202 and/or the lower page 206). The hard bit data of the first logical page may be maintained at the controller 106 of the data storage device 102 (e.g. in the hard bits storage 112) until all logical pages of the multiple logical pages 152-156 have been read.

Although various components depicted herein are illustrated as block components and described in general terms, such components may include one or more microprocessors, state machines, or other circuits configured to enable the data storage device 102 of FIG. 1 to perform the particular functions attributed to such components. For example, the reliability information generator 110 may represent physical components, such as hardware controllers, state machines, logic circuits, or other structures, to enable reliability information generator 110 to determine reliability information for one logical page by using soft bits of another logical page as soft bits. For example, in some embodiments the reliability information generator 110 may include one or more logical gates, one or more lookup tables, or a combination thereof.

Alternatively, one of more aspects of the functionality of the reliability information generator 110 may be implemented using a microprocessor or microcontroller programmed to perform the respective functionality. In a particular embodiment, the MLC memory 104 includes executable instructions that are executed by a processor in the controller 106. Alternatively, or in addition, executable instructions that are executed by a processor in the controller 106 may be stored at a separate memory location that is not part of the MLC memory 104, such as at a RAM or at a read-only memory (ROM).

In a particular embodiment, the data storage device 102 may be a portable device configured to be selectively coupled to one or more external devices. However, in other embodiments, the data storage device 102 may be attached or embedded within one or more host devices, such as within a housing of a portable communication device. For example, the data storage device 102 may be within a packaged apparatus such as a wireless telephone, a personal digital assistant (PDA), a gaming device or console, a portable navigation device, a computer device, or other device that uses internal non-volatile memory. In a particular embodiment, the data storage device 202 includes a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
    in a data storage device having a multi-level cell (MLC) memory, performing:
        determining a first hard bit of a first logical page, the first hard bit corresponding to a particular cell of the MLC memory;
        sensing a second hard bit of a second logical page, the second hard bit corresponding to the particular cell; and
        using the first hard bit as a soft bit of the second logical page to provide reliability information during a decode operation of the second logical page.

2. The method of claim 1, wherein using the first hard bit as the soft bit of the second logical page includes determining a reliability indicator for the second hard bit as a function of a value of the first hard bit.

3. The method of claim 2, wherein the reliability indicator is determined by using the value of the first hard bit as an index to a table lookup operation.

4. The method of claim 2, wherein the reliability indicator is determined according to a logical function of one or more hard bit values of the particular cell.

5. The method of claim 2, wherein the reliability indicator is determined at least partially based on a difference between a sensed value of the first hard bit and a decoded value of the first hard bit.

6. The method of claim 1, further comprising:
sensing a third hard bit of a third logical page, the third hard bit corresponding to the particular cell; and
using the first hard bit as a soft bit of the third logical page.

7. The method of claim 1, wherein the first hard bit is determined prior to initiating the decoding operation of the second hard bit in response to receiving an instruction to read the second logical page.

8. The method of claim 1, wherein the first hard bit and the second hard bit are sensed in response to receiving an instruction to perform a soft read that includes sensing hard bits and soft bits of the second logical page.

9. The method of claim 1, wherein in response to receiving an instruction to perform a sequential read of multiple logical pages of a group of cells including the particular cell, hard bits of the first logical page of the group of cells are sensed prior to sensing any other logical page of the group of cells.

10. The method of claim 9, wherein hard bit data of the first logical page is maintained at a controller of the data storage device until all logical pages of the multiple logical pages have been read.

11. The method of claim 9, wherein the first logical page is selected based on a number of transitions of the first logical page in a mapping of bits to states of the group of cells.

12. The method of claim 9, wherein the first logical page is selected from among multiple logical pages to be a hard bits page providing a highest correction capability as a virtual soft bit page for the other logical pages.

13. The method of claim 9, wherein during programming of data to the group of cells, a mapping between logical pages and physical pages of a word line is set according to which a hard bits page of multiple hard bits pages of the group of cells that provides a highest correction capability as a virtual soft bit page is mapped to a first sequential logical page of the word line, such that, during a sequential read operation of the data from the group of cells, the hard bits page providing the highest correction capability as a virtual soft bit page is sensed prior to sensing any of the other hard bits pages of the group of cells.

14. A data storage device comprising:
a multi-level cell (MLC) memory; and
a controller configured to receive sensed information from the MLC memory, the sensed information corresponding to hard bits including a first hard bit of a first logical page of a particular cell of the MLC memory and a second hard bit of a second logical page of the particular cell, and to generate reliability information by using the first hard bit as a soft bit of the second logical page,
wherein the controller is further configured to initiate a decode operation of the second logical page using the reliability information.

15. The data storage device of claim 14, wherein the reliability information includes a reliability indicator for the second hard bit that is determined as a function of a value of the first hard bit.

16. The data storage device of claim 15, wherein the reliability indicator is determined by using the value of the first hard bit as an index to a table lookup operation.

17. The data storage device of claim 15, wherein the reliability indicator is determined according to a logical function of one or more hard bit values of the particular cell.

18. The data storage device of claim 15, wherein the controller includes an error correction coding (ECC) engine, and wherein the reliability indicator is determined at least partially based on a difference between a sensed value of the first hard bit and a decoded value of the first hard bit.

19. The data storage device of claim 14, wherein the hard bits further include a third hard bit of a third logical page, the third hard bit corresponding to the particular cell, and wherein the controller is further configured to use the first hard bit as a soft bit of the third logical page.

20. The data storage device of claim 14, wherein the controller is configured to determine the first hard bit prior to initiating the decoding operation of the second logical page in response to receiving an instruction to read the second logical page, the instruction being received prior to the first hard bit being determined.

21. The data storage device of claim 14, wherein, in response to receiving an instruction to perform a soft read that includes sensing hard bits and soft bits of the second logical page, the controller is configured to instruct the MLC memory to sense hard bits of the first logical page and hard bits of the second logical page.

22. The data storage device of claim 14, wherein in response to receiving an instruction to perform a sequential read of multiple logical pages of a group of cells including the particular cell, the controller is configured to instruct the MLC memory to sense hard bits of the first logical page of the group of cells prior to sensing any other logical page of the group of cells.

23. The data storage device of claim 22, wherein the controller is configured to maintain hard bit data of the first logical page until all logical pages of the multiple logical pages have been read.

24. The data storage device of claim 22, wherein the first logical page is selected based on a number of transitions of the first logical page in a mapping of bits to states of the group of cells.

* * * * *